United States Patent
Paton et al.

(10) Patent No.: US 6,432,805 B1
(45) Date of Patent: Aug. 13, 2002

(54) CO-DEPOSITION OF NITROGEN AND METAL FOR METAL SILICIDE FORMATION

(75) Inventors: Eric N. Paton, Morgan Hill; Minh Van Ngo, Fremont, both of CA (US); Paul R. Besser, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/783,620

(22) Filed: Feb. 15, 2001

(51) Int. Cl.⁷ .................. H01L 21/3205; H01L 21/4763
(52) U.S. Cl. .................. 438/592; 438/299; 438/303; 438/652; 438/683
(58) Field of Search ............... 438/229, 230, 438/299, 303, 592, 655, 664, 682, 683

(56) References Cited

U.S. PATENT DOCUMENTS

| | | | |
|---|---|---|---|
| 5,508,212 A | * 4/1996 | Wang et al. | 438/305 |
| 5,970,370 A | * 10/1999 | Besser et al. | 438/586 |
| 6,281,102 B1 | * 8/2001 | Cao et al. | 438/592 |

FOREIGN PATENT DOCUMENTS

JP   10294459 A   * 11/1998

OTHER PUBLICATIONS

Hansen, Max, *Constitution of Binary Alloys*, 1038–1043, Genium Publising Corp, Schenectady, New York, 1985.

Gas, P., et al., "Kinetics of Formation of TM Silicide Thin Films: Self–Diffusion", *Properties of Metal Silicides*, ed. Karen Maex and Marc Van Rossum, 279–292, IMEC, Leuven, Belgium, 1995.

Lu, S.W., et al., "Epitaxial Growth of $NiSi_2$ on Ion–Implanted Silicoin at 250–280° C", *Appl. Phys. Lett.*, 49 (26), 1770–1772, Dec., 1986.

Kim, Gi Bum, "Ex Situ Formation of Oxide–Interlayer–Mediated–Epitaxial $CoSi_2$ Film Using Ti Capping", *J. Vac. Sci. Technol.* B 17 (1), 162–165, Jan./Feb. 1999.

* cited by examiner

Primary Examiner—Caridad Everhart
Assistant Examiner—Craig P. Lytle

(57) ABSTRACT

Salicide processing is implemented with silicon nitride sidewall spacers by initially depositing a refractory metal, e.g., Ni, in the presence of nitrogen to form a metal nitride layer to prevent the reaction of the deposited metal with free Si in silicon nitride sidewall spacers, thereby avoiding bridging between the metal silicide layer on the gate electrode and the metal silicide layers on the source/drain regions of a semiconductor device.

12 Claims, 2 Drawing Sheets

CO-DEPOSITION OF NITROGEN AND METAL FOR METAL SILICIDE FORMATION

FIELD OF THE INVENTION

The present invention relates to semiconductor device fabrication, particularly to self-aligned silicide (salicide) technology.

BACKGROUND ART

As gate electrode lengths are scaled down, the source and drain junctions and polycrystalline silicon line width must also be scaled down. However, scaling down the source and drain junctions and polycrystalline line width increases parasitic resistance in the source and drain diffusion layers and the gate electrode, and also increases the sheet and contact resistance of the gate electrode and source/drain regions.

Salicide technology comprises forming metal silicide layers on the source/drain regions and/or on the gate electrode of a semiconductor device in a self-aligned manner. A conventional approach to reduce resistivity involves forming a multi-layered structure consisting of a low resistance refractory metal silicide layer on a doped polycrystalline silicon, typically referred to as a polycide. Salicide technology reduces parasitic, sheet and contact resistance in the source and drain diffusion layers and the gate electrode that results from scaling down the source and drain junctions and polycrystalline silicon line width.

Silicides are typically formed by reacting a metal with silicon (Si) within a specified temperature range for a specific period of time. Silicide layers may be self-aligned by different techniques. For example, the metal can be selectively deposited on the gate electrode and on the source/drain regions, with subsequent annealing to react the metal with underlying Si of the source/drain regions and the gate electrode to form the metal silicide layers. Alternatively, sidewall spacers, e.g., silicon nitride or silicon dioxide, are formed on the side surfaces of the gate electrode, followed by a blanket deposition of metal and annealing to react the metal with Si in the gate electrode and the source/drain regions, while the sidewall spacers prevent reaction with Si from the side surfaces of the gate electrode.

During annealing, the wafer is heated to a reaction temperature and held at the reaction temperature for a period of time sufficient for the metal layer to react with underlying Si to form a metal silicide layer on the source/drain regions and the gate electrode. Multiple annealing steps may be employed.

Various metals react with Si to form a metal silicide; however, titanium (Ti) and cobalt (Co) are currently the most common metals used to create metal silicides when manufacturing semiconductor devices utilizing salicide technology. Recently, attention has turned towards nickel (Ni) to form nickel silicide utilizing salicide technology. Nickel silicide avoids many limitations associated with $TiSi_2$ and $CoSi_2$. Unlike Ti where Si diffuses into the metal layer when forming a Ti silicide, Ni, like Co, diffuses into Si, which helps to limit bridging between the metal silicide layer on the gate electrode and a metal silicide layer on the associated source/drain regions. The formation of nickel silicide requires less Si than $TiSi_2$ and $CoSi_2$. Nickel silicide also exhibits almost no linewidth dependence on sheet resistance. Nickel silicide is normally annealed in a one step process, vis-a-vis a process requiring an anneal, an etch, and a second anneal, as occurs in $TiSi_2$ and $CoSi_2$ saliciding. In addition, nickel silicide exhibits lower film stress, i.e., causes less wafer distortion, than conventional Ti or Co silicides.

Salicide processing efficiency is improved through the use of sidewall spacers. Sidewall spacers allow a blanket layer of metal to be deposited over the wafer surface. Sidewall spacers typically comprise silicon dioxide or silicon nitride, but silicon nitride sidewall spacers are often preferable because silicon nitride is highly conformal and the sidewall spacers can be added and removed as needed throughout the manufacturing process. However, the use of silicon nitride sidewall spacers with salicide technology results in bridging between the metal silicide layer on the gate electrode and the metal silicide layers on associated source/drain regions, particularly when Ni is used.

There is a need for salicide technology that avoids bridging between the metal silicide layer on the gate electrode and the metal silicide layers on the source/drain regions when using silicon nitride sidewall spacers, particularly when implementing nickel salicide.

DISCLOSURE OF THE INVENTION

These and other needs are satisfied by embodiments of the present invention, which provide a method of salicide processing in semiconductor device fabrication, the method comprising depositing a refractory metal in the presence of nitrogen (N) on a wafer having a polysilicon gate electrode, source/drain regions, and silicon nitride sidewall spacers to form a metal nitride layer, suspending N flow, depositing the refractory metal over the metal nitride layer on the wafer, heating the wafer to react the refractory metal and Si to form a metal silicide layer on the polysilicon gate electrode and source/drain regions, and wet chemical stripping the unreacted metal and remaining metal nitride from the wafer. In an embodiment of the present invention, the refractory metals used to form the metal nitride and metal silicide layers include Ni, Co, Ti, platinum (Pt), tantalum (Ta) and tungsten (W).

A further aspect of the present invention relates to a semiconductor device that includes a polysilicon gate electrode, source/drain regions, and silicon nitride sidewall spacers, wherein a metal silicide layer is formed over the polysilicon gate electrode and source/drain regions without associated bridging between the metal silicide layer on the gate electrode and the metal silicide layers over the source/drain regions. In order to avoid bridging, a metal nitride layer is created by depositing a refractory metal, e.g., Co, Ti, Ta, Pt, Ni and W, on the wafer in the presence of N. Nitrogen flow is then suspended and the refractory metal is deposited over the metal nitride layer. A metal silicide layer, e.g., NiSi, is formed on the polysilicon gate electrode and source/drain regions by heating the wafer to react the refractory metal with available Si. Unreacted refractory metal and metal nitride are removed from the wafer by wet chemical stripping.

An advantage of the present invention is the ability to limit metal bonding with free Si in the silicon nitride sidewall spacers by initially depositing the refractory metal in the presence of N. The N bonds with free Si in the silicon nitride sidewall spacers, thereby removing such free Si so that it is not available to react with deposited metal and cause bridging between the metal silicide layer on the gate electrode and the metal silicide layers on associated source/drain regions.

The nitriding process also beneficially forms a mediating layer that prevents the deposited refractory metal from reacting with free Si, but allows the deposited metal to diffuse through the mediating layer during annealing to form the desired metal silicide layers on the gate electrode and source/drain regions. The metal nitride mediating layer thereby advantageously enables control of the metal silicide transformation rate.

Other advantages of the present invention will become readily apparent to those skilled in the art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF THE INVENTION

Figure 1:
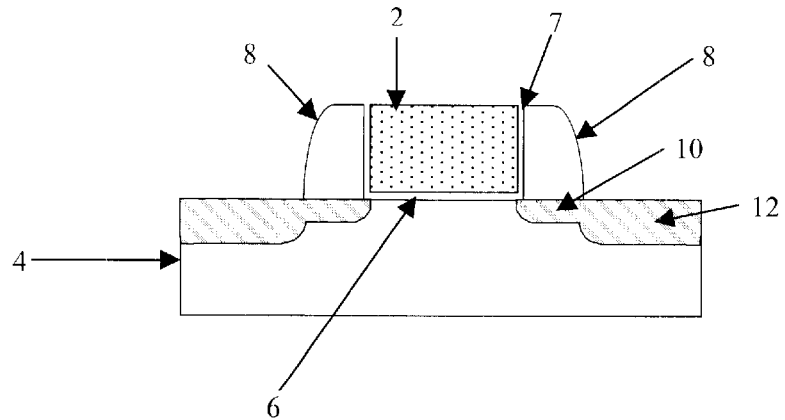
FIGS. 1–3 schematically illustrate sequential phases of a prior art salicide technique resulting in bridging.

The present invention addresses and solves problems related to formation of a metal silicide layer on the gate electrode and source/drain regions of a semiconductor device. As device geometries shrink into the deep submicron regime, metal silicide bridging occurs along the surface of silicon nitride sidewall spacers between the metal silicide layer on the gate electrode and metal silicide layers on associated source/drain regions. For example, adverting to FIG. 1, in attempting to implement nickel silicide technology utilizing silicon nitride sidewall spacers, a gate electrode 2 is formed on substrate 4 with a gate insulating layer 6 therebetween. A spacer liner oxide 7 is disposed as a buffer layer on the side surfaces of the gate electrode 2. A conformal layer of silicon nitride is then deposited followed by anisotropic etching to form silicon nitride sidewall spacers 8 on opposing side surfaces of gate electrode 2. After anisotropic etching, contamination such as etching residues are removed by wet cleaning. Shallow source/drain extensions 10 and source/drain regions 12 are formed in a conventional manner.

Figure 2:
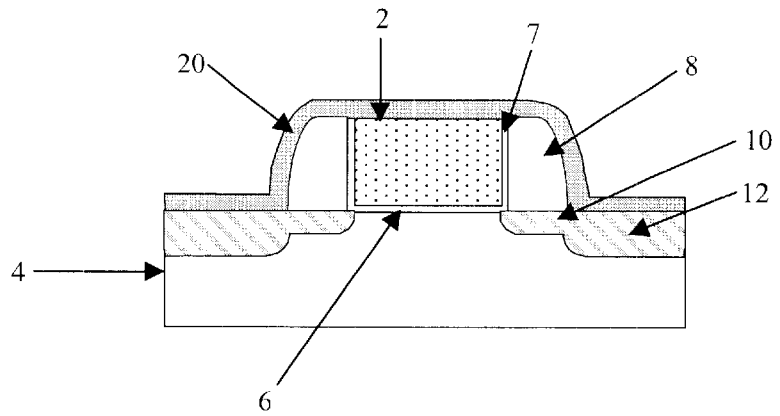

Adverting to FIG. 2, a Ni layer 20 is deposited over the wafer surface. The wafer is then subject to annealing to react Ni with the underlying Si.

Figure 3:
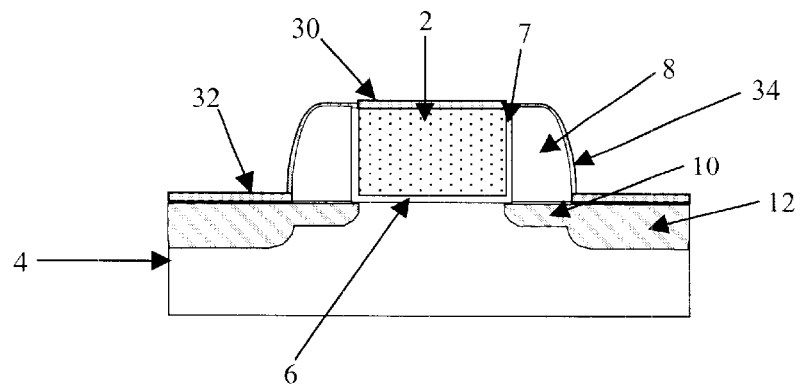

As shown in FIG. 3, following heating, a nickel silicide layer 30 is formed on the upper surface of gate electrode 2 and a layer of nickel silicide 32 is formed on associated source/drain regions 12. However, it was found that a thin layer of nickel silicide 34, as at a thickness of about 30 Å to 60 Å, is undesirably formed along the exposed surfaces of silicon nitride sidewall spacers 8 causing bridging and, hence, shorting between nickel silicide layer 30 and nickel silicide layers 32.

After considerable experimentation and investigation, it was postulated that the problem of nickel silicide formation 34 along the silicon nitride sidewall spacers 8 stemmed from the reaction of Ni with dangling Si bonds in the silicon nitride sidewall spacers 8. The present invention addresses and solves such problems by preventing a reaction between a deposited refractory metal, e.g., Ni, and dangling Si bonds in the silicon nitride sidewall spacers 8.

In accordance with embodiments of the present invention, a refractory metal layer is initially deposited over the gate electrode, source/drain regions and silicon nitride sidewall spacers in the presence of nitrogen (N). It was found that initial metal deposition in such an environment advantageously allows the N to bond with free Si in the silicon nitride sidewall spacers so that reaction between the deposited refractory metal and Si in the silicon nitride sidewall spacers is reduced, thereby avoiding metal silicide bridging, such as that denoted by reference numeral 34 in FIG. 3.

Figure 4:
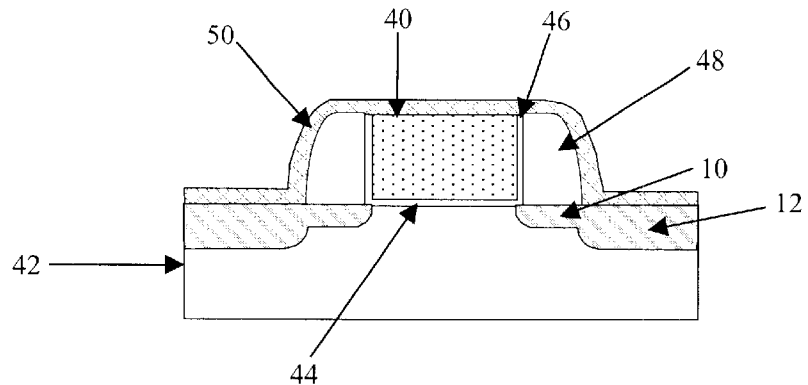
FIGS. 4–6 schematically illustrate sequential phases of a method in accordance with embodiments of the present invention without bridging between the metal silicide layer on the gate electrode and the metal silicide layers on the associated source/drain regions.
Figure 5:
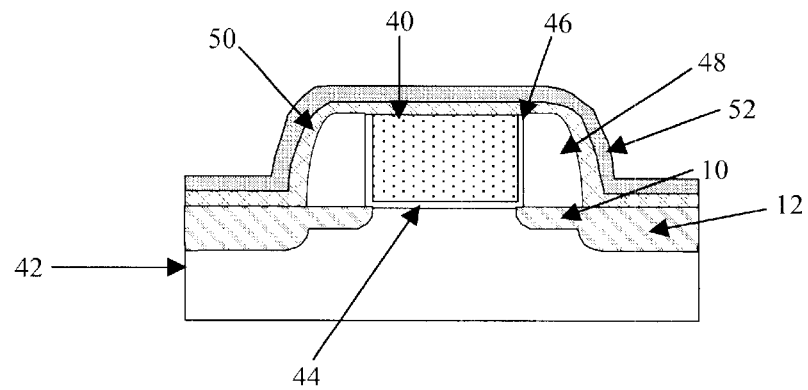
Figure 6:
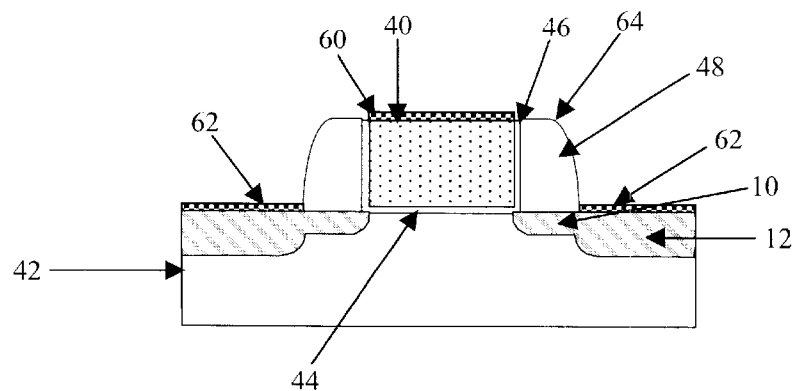

An embodiment of the present invention is schematically illustrated in FIGS. 4 through 6, wherein similar reference numerals denote similar features. Adverting to FIG. 4, a gate electrode 40, e.g., doped polycrystalline silicon, is formed on substrate 42, which can be n-type or p-type doped silicon, with a gate insulating layer 44 therebetween. Gate insulating layer 44 is typically silicon dioxide formed by thermal oxidation or chemical vapor deposition (CVD). A spacer liner oxide 46 is disposed on the opposing side surfaces of gate electrode 40 as a buffer between the silicon nitride sidewall spacers 48 and the side surfaces of the gate electrode 40. Shallow source/drain extensions 10 and source/drain regions 12 are formed in a conventional manner.

Subsequent to forming silicon liner oxide 46, silicon nitride sidewall spacers 48 are formed by depositing a conformal layer and anisotropic etching. Silicon nitride sidewall spacers 48 can be formed by plasma-enhanced chemical vapor deposition (PECVD). After anisotropic etching, contamination such as etching residues are removed by wet cleaning.

As depicted in FIG. 4, a refractory metal is deposited, as by sputtering or other method, on the wafer in the presence of nitrogen (N) to form a metal nitride layer 50. The refractory metal comprises cobalt (Co), platinum (Pt), titanium (Ti), tungsten (W), tantalum (Ta) and nickel (Ni). In an embodiment of the present invention, Ni is used to form a nickel nitride layer. Given the disclosed objectives, the optimum deposition conditions and nitride layer thickness can be determined in a particular situation. For example, it was found suitable to deposit Ni in the presence of N for approximately 2 seconds to approximately 5 seconds to form a nickel silicide layer at a thickness of about 10 Å to about 80 Å.

Once the metal nitride layer 50 is formed, N flow is stopped. In an embodiment of the present invention, N flow is discontinued by suspending refractory metal deposition, stopping N flow, flowing argon (Ar) until N is eliminated from the sputtering chamber and reigniting the field plasma. Alternatively, N flow is suspended without interrupting metal deposition.

Turning to FIG. 5, metal silicide layer formation is implemented by depositing a refractory metal layer 52, e.g., Co, Pt, Ti, W, Ta or Ni, over the metal nitride layer 50. In an embodiment of the present invention, the same refractory metal used to form the metal nitride layer 50 is used to form the metal silicide layer, e.g., Ni is deposited to form a nickel nitride layer and a nickel silicide layer. It is to be appreciated by one skilled in the art that embodiments of the present invention can be adapted to use one refractory metal for the metal nitride layer 50 and another refractory metal for the metal silicide layer.

As illustrated in FIG. 6, once the refractory metal is deposited over the metal nitride layer 50, heating is conducted to silicidize the metal, as by rapid thermal annealing or furnace annealing, to react the refractory metal with the underlying Si to form a metal silicide layer 60 on the polysilicon gate electrode 40 and metal silicide layers 62 on the source/drain regions 12. When Ni is the refractory metal used, rapid thermal annealing, as at a temperature of approximately 350° C. to approximately 600° C., such as approximately 380° C. to approximately 550° C., e.g., approximately 450° C., is conducted during which a nickel silicide layer 60, e.g., NiSi, Ni$_2$Si or Ni$_3$Si, is formed on gate electrode 40 while nickel silicide layers 62 are formed on source/drain regions 12 adjacent to the silicon nitride sidewall spacers 48. The N in the metal nitride layer advantageously ties up free Si in the silicon nitride sidewall spacers 48 preventing silicidation of the deposited metal thereon and, hence, preventing bridging.

Deposited Ni diffuses through the thin nitride layers on the gate electrode and source/drain regions to form the desired nickel silicide layers. By avoiding refractory metal bonding with free Si on the surface region 64 of the silicon nitride sidewall spacers 48, reaction of the metal layer 52 with Si in the silicon nitride sidewall spacers 48 is effectively prevented. Accordingly, the inventive methodology avoids the formation of metal silicide on the silicon nitride sidewall spacers 48 and, hence, prevents bridging between the metal silicide layer 60 on the upper surface of gate electrode 40 and metal silicide layers 62 on the source/drain regions 12 adjacent to the silicon nitride sidewall spacers 48.

Unreacted metal and metal nitride on the surfaces of the silicon nitride sidewall spacers 48 are then easily removed, as by wet chemical stripping. In an embodiment of the present invention, the unreacted refractory metal and metal nitride are removed by immersing the wafer into a solution of H$_2$SO$_4$, H$_2$O$_2$ and water (SPM) or a solution of NH$_4$OH, H$_2$O$_2$ and water (APM) followed by immersing the wafer in a solution of H$_2$SO$_4$, H$_2$O$_2$ and water (SPM).

The present invention, therefore, enables the implementation of metal silicide methodology, advantageously utilizing silicon nitride sidewall spacers 48 without bridging between the metal silicide layer 60 formed on the upper surface of the gate electrode 40 and the metal silicide layers 62 formed on associated source/drain regions 12.

Another aspect of the present invention relates to a semiconductor device that includes a polysilicon gate electrode 40, source/drain regions 12, and silicon nitride sidewall spacers 48, wherein metal silicide layers 60 and 62 respectively are formed on the polysilicon gate electrode 40 and source/drain regions 12. The metal silicide layers 60 and 62 are formed by depositing a refractory metal, e.g., Co, Ti, Pt, Ta, Ni and W, on the wafer in the presence of N. Nitrogen flow is then suspended and the refractory metal is deposited on the metal nitride layer 50. Metal silicide layers 60 and 62, e.g., NiSi, are formed on the polysilicon gate electrode 40 and source/drain regions 12 by heating the wafer to react the refractory metal with Si. Unreacted refractory metal and metal nitride are removed by wet chemical stripping.

The present invention enjoys industrial applicability in fabricating any of various types of semiconductor devices. The present invention has particular applicability in semiconductor devices with high circuit speeds having design features in the deep sub-micron regime.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein. Well-known processing structures have not been described in detail in order not to unnecessarily obscure the present invention.

What is claimed is:

1. A method of salicide processing in semiconductor device manufacture, the method comprising the steps of:

forming a gate electrode, with an upper surface and side surfaces, overlying a silicon substrate with a gate dielectric layer therebetween and source/drain regions in the substrate and a silicon nitride sidewall spacer disposed on each side surface with a silicon liner oxide therebetween;

depositing a refractory metal in the presence of nitrogen (N) to form a metal nitride layer on the sidewall spacers, upper surface of the gate electrode and the source/drain regions;

suspending N flow;

depositing the refractory metal on the metal nitride layer;

heating to react the refractory metal with silicon (Si) to form a metal silicide layer on the polysilicon gate electrode and a metal silicide layer on the source/drain regions; and wet chemical stripping the unreacted refractory metal and metal nitride.

2. The method of claim 1, wherein the refractory metal comprises cobalt, titanium, platinum, tungsten, tantalum and nickel (Ni).

3. The method of claim 2, wherein the refractory metal comprises Ni.

4. The method of claim 1, comprising depositing the refractory metal in the presence of N for approximately 2 seconds to approximately 5 seconds.

5. The method of claim 1, wherein the step of suspending N flow comprises:

suspending the refractory metal deposition;

stopping the N flow;

flowing argon (Ar) to purge and remove N; and reigniting a field plasma.

6. The method of claim 3, comprising heating to form the metal silicide layers at a temperature of approximately 350° C. to approximately 600° C.

7. The method of claim 6, comprising heating to form the metal silicide layers at a temperature of approximately 380° C. to approximately 550° C.

8. The method of claim 7, comprising heating to form the metal silicide layers at a temperature of approximately 450° C.

9. The method of claim 6, wherein the metal silicide layer is NiSi.

10. The method of claim 1, comprising wet chemical stripping the unreacted refractory mental and metal nitride by immersing the substrate in a solution of H$_2$SO$_4$, H$_2$O$_2$ and water (SPM).

11. The method of claim 1, wherein wet chemical stripping the unreacted refractory metal and metal nitride comprises:

immersing the substrate in a solution of NH$_4$OH, H$_2$O$_2$ and water (APM);and immersing the substrate in a solution of H$_2$SO$_4$, H$_2$O$_2$ and water (SPM).

12. A semiconductor device produced by the method of claim 1.

\* \* \* \* \*